United States Patent [19]

Eilley

[11] Patent Number: 5,650,737
[45] Date of Patent: Jul. 22, 1997

[54] PROTECTED SWITCH

[75] Inventor: Edward S. Eilley, Reigate, England

[73] Assignee: U.S. Philips Corporation, New York, N.Y.

[21] Appl. No.: 541,379

[22] Filed: Oct. 10, 1995

[30] Foreign Application Priority Data

Oct. 12, 1994 [GB] United Kingdom .................. 9420576
Nov. 16, 1994 [GB] United Kingdom .................. 9423076

[51] Int. Cl.$^6$ .......................... H03K 17/687; H03K 3/00
[52] U.S. Cl. .................. 327/108; 327/538; 327/427; 327/327
[58] Field of Search .................. 327/50, 51, 77, 327/80, 81, 87, 480, 479, 204, 577, 316, 323, 574, 581, 108–112, 538–543, 427, 478, 306, 309, 327, 328

[56] References Cited

U.S. PATENT DOCUMENTS

| | | | |
|---|---|---|---|
| 4,136,354 | 1/1979 | Dobkin | 357/36 |
| 4,577,125 | 3/1986 | Allen | 326/91 |
| 4,893,158 | 1/1990 | Mihara et al. | 357/23.13 |
| 5,061,863 | 10/1991 | Mori et al. | 327/478 |
| 5,091,664 | 2/1992 | Furuhata | 327/584 |
| 5,272,392 | 12/1993 | Wong et al. | 327/109 |
| 5,396,117 | 3/1995 | Housen et al. | 327/577 |
| 5,500,619 | 3/1996 | Miyasaka | 327/427 |

*Primary Examiner*—Toan Tran
*Attorney, Agent, or Firm*—Steven R. Biren

[57] ABSTRACT

A power semiconductor device (P) has first and second main electrodes (D) and (S) for coupling a load (L) between first and second voltage supply lines (2 and 3), a control electrode (G) coupled to a control voltage supply line (4) and a sense electrode (S1) for providing in operation of the power semiconductor device (P) a current that flows between the first and sense electrodes (D and S1) and is indicative of the current that flows between the first and second main electrodes (D and S). A current mirror arrangement (5) is provided having a first current path (5a) for passing a given current ($I_1$) and a second current path (5b) for mirroring the given current. A control semiconductor device (M3) has first and second main electrodes (d and s) coupled between the control electrode (G) and the second main electrode (S) of the power semiconductor device (P) and a control electrode (g) coupled to the second current path (5b). The sense electrode (S1) of the power semiconductor device (P) is coupled to the second current path (5b) for causing, when the current provided by the sense electrode (S1) approaches the given current ($I_1$) the control semiconductor device (M3) to be rendered conducting to provide a conductive path between the control and the second main electrodes (G and S) of the power semiconductor device (P) to reduce the voltage at the control electrode and so regulate the current through the power semiconductor device.

9 Claims, 3 Drawing Sheets

PROTECTED SWITCH

BACKGROUND OF THE INVENTION

This invention relates to a protected switch.

U.S. Pat. No. 4,893,158 describes a protected switch in the form of a power semiconductor device having first and second main electrodes for coupling a load between first and second voltage supply lines, a control electrode coupled to a control voltage supply line and a sense electrode for providing in operation of the device a current that flows between the first and sense electrodes and is indicative of the current that flows between the first and second main electrodes. A control semiconductor device has first and second main electrodes coupled between the control electrode and the second main electrode of the power semiconductor device and a control electrode coupled to the sense electrode of the power semiconductor. The control electrode of the control semiconductor device is coupled via a current path provided by a sense resistor to the second main electrode of the power semiconductor device so that, when the current provided by the sense electrode approaches the given current, the control semiconductor device is rendered conducting to provide a conductive path between the control and the second main electrodes of the power semiconductor device to regulate the operation of, in particular to regulate the current through, the power semiconductor device.

In the protected switch described in U.S. Pat. No. 4,893,158, the control semiconductor device effectively forms an inverter with the series gate resistance Ri of the power semiconductor device, the sensed current through the sense resistor Rs determining the gate drive. This results in a low gain which makes the regulation of the current of the power semiconductor device imprecise and dependent on the external gate drive, the value of the gate series resistance Ri and process parameters. Also, the negative temperature coefficient of the control semiconductor device at low threshold voltages, that is close to the point at which the control semiconductor device becomes conducting, and the typically positive temperature coefficient of the sense resistor result in an overall negative temperature coefficient for the output current limiting value of the circuit. In addition, where as described in U.S. Pat. No. 4,893,158, the sense electrode is provided by a current mirror MOS component made up of one or more cells substantially identical to the cells of the main power semiconductor device, the ratio between the current through the power semiconductor device and the current supplied through the relatively high value sense resistor Rs from the sense electrode will be a function of the process-dependent electrical parameters of the power semiconductor device and the current mirror or sense cell as well as their geometrical ratio because these two devices will be operating with dissimilar voltages between their control and second main electrodes and between their first and second main electrodes. This makes the operation of the design difficult to predict and results in poor precision. Furthermore, when the voltage between the first and second main electrodes of the power semiconductor device is low, the circuit may not function because the resultant voltage at the control electrode of the control semiconductor device may not be sufficient to turn on the control semiconductor device when required. As the voltage between the first and second main electrodes of the power semiconductor device rises, then the circuit will enter a negative resistance region as it begins to operate which may result in oscillatory action with certain types of loads such as inductors.

SUMMARY OF THE INVENTION

According to the present invention, there is provided a protected switch comprising a power semiconductor device having first and second main electrodes for coupling a load between first and second voltage supply lines, a control electrode coupled to a control voltage supply line and a sense electrode for providing in operation of the power semiconductor device a current that flows between the first and sense electrodes and is indicative of the current that flows between the first and second main electrodes, a current mirror arrangement having a first current path for passing a given current and a second current path for mirroring the given current and a control semiconductor device having first and second main electrodes coupled between the control electrode and the second main electrode of the power semiconductor device and a control electrode coupled to the second current path, the sense electrode of the power semiconductor being coupled to the second current path for causing, when the current provided by the sense electrode approaches the given current, the control semiconductor device to be rendered conducting to provide a conductive path between the control and the second main electrodes of the power semiconductor device to reduce the voltage at the control electrode and so regulate the current through the power semiconductor device.

The sense electrode and the control electrode of the control transistor are generally coupled to the same one of the first and second electrodes of the second transistor.

A protected switch in accordance with the invention avoids the use of a relatively high value sense resistor as in the protected switch described in U.S. Pat. No. 4,893,158 and thus allows for a higher gain and thus a more precise sense current which is less dependent on the external gate drive, the value of the gate series resistance and process parameters. Furthermore, the current through the power semiconductor device may be regulated so as to have a desired temperature coefficient selected by the user by the use of an appropriate bias for the current mirror arrangement. Thus, the regulated current may have a positive or negative temperature coefficient, as desired, depending upon the bias arrangement of the current mirror arrangement.

The first current path of the current mirror arrangement may comprise the current path between the first and second main electrodes of a first transistor and the second current path of the current mirror arrangement may comprise the current path between the first and second main electrodes of a second transistor, the first and second transistor having coupled control electrodes with one of the first and second transistor being diode-connected.

The control transistor and current mirror arrangement may be carried by the semiconductor body carrying the power semiconductor device.

The power semiconductor device may comprise a first plurality of device cells coupled in parallel between the first and second main electrodes and a second smaller plurality of similar device cells coupled in parallel between the sense electrode and the first main electrode of the power semiconductor device.

The power semiconductor device may, for example, comprise a power MOSFET structure. For example, the power semiconductor device may be a power MOSFET or may be a device such as an insulated gate bipolar transistor or other mixed bipolar MOSFET device incorporating a power MOSFET structure. Of course, the power semiconductor device could be a power bipolar device such as a power bipolar transistor.

BRIEF DESCRIPTION OF THE DRAWINGS

Embodiments of the present invention will now be described, by way of example, with reference to the accompanying drawing, in which.

It should of course be understood that the drawings are not to scale and that like reference numerals are used throughout text to refer to like parts.

DESCRIPTION OF THE PREFERRED EMBODIMENTS

Figure 1:
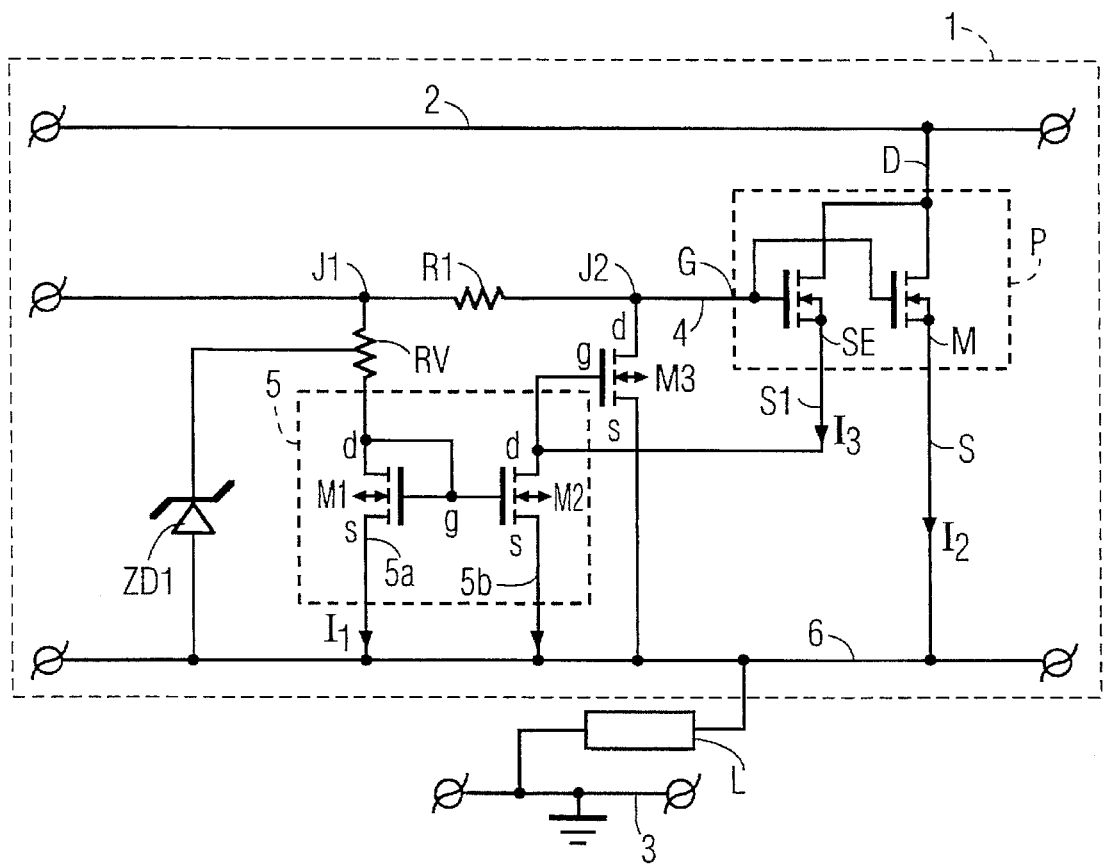
FIG. 1 shows a circuit diagram of one example of a protected switch in accordance with the invention.

Referring now to the drawings, especially FIG. 1, there are illustrated protected switch I which comprises a power semiconductor device P having first and second main electrodes D and S for coupling a load L between first 2 and second 3 voltage supply lines and a control electrode G coupled to a control voltage supply line 4 and a sense electrode S1 for providing in operation of the power semiconductor device a current that flows between the first and sense electrodes D and S1 and is indicative of the current that flows between the first and second main electrodes D and S, a current mirror arrangement 5 having a first current path 5a for passing a given current $I_1$ and a second current path 5b for mirroring the given current $I_1$ and a control semiconductor device M3 having first and second main electrodes S and D coupled between the control electrode G and the second main electrode S of the power semiconductor device P and a control electrode G coupled to the second current path 5b, the sense electrode S1 of the power semiconductor device being coupled to the second current path 5b for causing, when the current provided by the sense electrode S1 approaches the given current $I_1$, the control semiconductor device M3 to be rendered conducting to provide a conductive path between the control G and the second main S electrodes of the power semiconductor device P to reduce the voltage at the control electrode and so regulate the current through the power semiconductor device P.

A protected switch in accordance with the invention thus enables the current through the power semiconductor device to be limited to, as a maximum, the determined given current It while avoiding the use of a relatively high value sense resistor as in the protected switch described in U.S. Pat. No. 4,893,158 and thus allows for a higher gain and thus a more precise sense current which is less dependent on the external gate drive, the value of the gate series resistance and process parameters. Furthermore, the current through the power semiconductor device may be regulated so as to have a desired temperature coefficient selected by the user by the use of an appropriate bias for the current mirror arrangement. Thus, the regulated current may have a positive or negative temperature coefficient, as desired, depending upon the bias arrangement of the current mirror arrangement.

Referring now specifically to the example shown in FIG. 1, in this case the power semiconductor device P comprises a power MOSFET which, as will be explained below, comprises a plurality of parallel-connected source cells. The power MOSFET has, in a manner similar to that described in EP-B-0139998 or U.S. Pat. No. 4,136,354, a main current carrying section M and a subsidiary or emulation current carrying section SE. The main current carrying section comprises a first plurality of parallel-connected source cells while the subsidiary current carrying section SE comprises a second plurality, smaller than the first plurality, of similar, generally identical, source cells. The main and subsidiary current carrying sections M and SE share a common first or drain electrode D and common gate or control electrode G. The source cells of the subsidiary current carrying section are not, however, coupled to the second main or source electrode S of the main current carrying section but are coupled to an auxiliary or sense electrode S1. As will be appreciated by those skilled in the art and as will be explained below, this may be achieved by appropriate patterning of the source metallisation.

The drain electrode of the power MOSFET P is coupled to a first voltage supply line 2 while the source electrode S of the power MOSFET P is coupled via a load L to a second voltage supply line 3. Generally, the first voltage supply line 2 will be coupled in operation to a positive voltage source while the second voltage supply line 3 will be coupled to earth or ground as shown. The load may be any suitable load, for example, a light or automobile lamp or even a motor to be controlled by the protected switch 1.

The control or gate electrode G of the power MOSFET P is coupled to a control terminal 4.

In this example, a current mirror arrangement 5 is coupled between the gate and source electrodes G and S of the power MOSFET P by virtue of connection line 6. In this example, the current mirror arrangement 5 comprises first and second transistors M1 and M2 each having first and second main electrodes s and d and a control or gate electrode g. The first transistor M1 is diode-connected, that is it has its gate electrode g coupled to its drain electrode d. The control or gate electrode g of the first and second transistors M1 and M2 are coupled together. Thus, the main current path between the first and second electrodes s and d of the first transistor M1 provides the first current path 5a while the main current path between the first and second electrodes s and d of the second transistor M2 provides the second current path 5b. Although the first and second transistors M1 and M2 could be bipolar transistors, in the arrangement shown they are formed as n-channel insulated gate field effect or MOS transistors. It will be noticed that the back-gates bg of the first and second transistors M1 and M2 are not shown connected in FIG. 1. In practice, if the first and second transistors M1 and M2 are integrated in the same semiconductor body as the power MOSFET P, then their back-gates will generally be connected to the source electrode S of the power MOSFET P or to any other potential suitable for avoiding parasitic bipolar action within the integrated structure. Where the first and second transistors M1 and M2 are not integrated with the power MOSFET P, then their back-gates may be coupled to their respective source electrode s in the normal manner.

Of course, any other suitable form of current mirror arrangement 5 may be provided.

The source electrodes s of the first and second transistors M1 and M2 are coupled to the source electrode S of the power semiconductor device. The drain electrode d of the first transistor M1 is coupled via a variable resistor RV to the control or gate electrode G of the power MOSFET P while the drain electrode d of the second transistor M2 is coupled to the sense electrode S1 and to the gate or control electrode g of a third or control transistor M3 having its drain electrode d coupled to the gate electrode G of the power MOSFET P and its source electrode s coupled to the source electrode S of the power MOSFET P. As shown in FIG. 1, a resistor R1 is coupled between the junction points J1 and J2, that is between the resistor RV and the drain electrode d of the transistor M3.

A zener diode ZD1 or other suitable shunt regulator may be coupled between the mid tapping point of the variable resistor RV and the connection line 6 so as to stabilise the current $I_1$ flowing in the reference side of the current mirror arrangement 5 so as to make the given current independent of input voltage so long as the input voltage is sufficiently high.

In operation of the protected switch 1 shown in FIG. 1, when appropriate voltages are applied to the first and second voltage supply lines 2 and 3 and to the gate or control terminal 4, the power MOSFET P conducts to supply a current $I_2$, and thus power, to the load L. The sense electrode S1 supplies a current $I_3$ indicative of the current through the main current carrying section M. Generally, as a rough approximation, when the sense electrode S1 is at a similar potential to the source electrode S of the power MOSFET P, the ratio between the currents $I_2$ and $I_3$ will slightly exceed but be basically equivalent to the ratio between the first plurality of source cells in the main current carrying section M and the second plurality of source cells in the subsidiary or sense current carrying section SE, assuming that each source cell carries the same current. When the sense electrode S1 is at a higher potential than the source electrode S then the ratio between the currents $I_2$ and $I_3$ will be higher in accordance with the (process dependent) device characteristics.

The given current $I_1$ flowing along the first current path 5a of the current mirror arrangement 5 is determined at least in part by the resistance of the variable resistor RV and is, in this example, derived from the voltage between gate or control terminal 4 and the connection line 6.

While the sense current $I_3$ is below the given current $I_1$, the voltage at the gate electrode of the control transistor M3 will remain low and accordingly the transistor M3 will remain non-conducting. If, however, the current through the sense current carrying section S should approach the given current $I_1$, then the voltage at the gate of the control transistor M3 will rise causing the control transistor M3 to conduct and so couple the gate of the power MOSFET P to its source electrode S thereby reducing the gate drive until an equilibrium is found at which the reduced gate drive causes there to be sufficient sense current $I_3$ to maintain the continued conduction of the control transistor M3. The resistor R1 should help to stabilize the voltage at the drain of the transistor M1 when the transistor M3 is conducting. It is, of course, important that all the gain of the protected switch rolls off with frequency before any phase delay in the negative feedback approaches 180° or the feedback could become positive and oscillations occur. As is well known in the art, this may be achieved by using a single dominant pole in one stage to ensure that high frequency gain rolls off to less than unity with only a single 90° lag in the feedback signal. In the case of the protected switch shown in FIG. 1, the large input capacitance of the power semiconductor device P together with the limited drive capability to the control electrode G effectively forms a dominant pole so that the circuit does not oscillate.

The protected switch shown in FIG. 1 achieves a somewhat higher gain by providing a current sink in place of the high value sense resistor shown in U.S. Pat. No. 4,893,158. When this protected switch is operational, the voltage at the drain electrode d of the second transistor M2 should, providing the transistor has a relatively wide relatively short conduction channel area, be significantly above the knee of the Ids versus Vds characteristic so that the output current of the transistor M2 is substantially independent of its drain voltage. Moreover, the protected switch shown in FIG. 1 replaces the sense resistor load shown in U.S. Pat. No. 4,893,158 with a current sinking mirror arrangement whose temperature characteristics, amongst other things, can be modified. This allows the current through the power semiconductor device to be regulated so as to have a desired temperature coefficient selected by the user by the use of an appropriate bias for the current mirror arrangement. Thus, the regulated current may have a positive or negative temperature coefficient, as desired, depending upon the bias arrangement of the current mirror arrangement.

The protected switch may be of integrated form with one or more of the components being formed within the same semiconductor body as the power MOSFET P and one or more of the components possibly being formed on top of an insulating layer covering the semiconductor body within which the power MOSFET P is formed.

Figure 2:
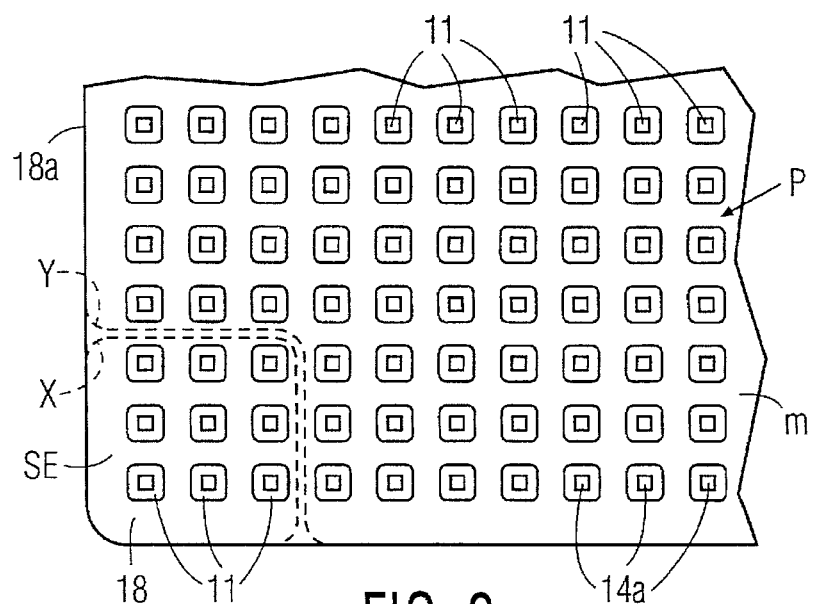
FIG. 2 shows a plan view of part of a semiconductor body carrying a protected such as that shown in FIG. 1.

FIGS. 2 and 3 illustrate by way of a plan view and cross-sectional views, respectively, of different parts of a semiconductor body 10 how different components which may be used to form a protected switch such as that shown in FIG. 1 may be formed.

The semiconductor body 10 comprises, in this example, a relatively highly doped n conductivity single crystal silicon substrate 10a on which is provided a relatively lowly doped n conductivity type silicon epitaxial layer 10b which forms the first region, generally the drain drift region, of the MOSFET P.

Figure 3A:
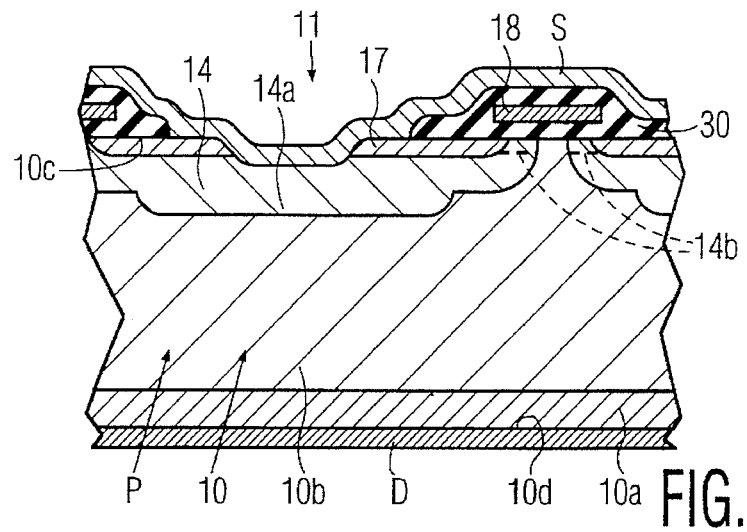
FIGS. 3a to 3f are cross-sectional views through parts of the semiconductor body for illustrating one possible structure for the various components of a protected switch such as that shown in FIG. 1.

FIG. 2 illustrates a top plan view of part of the semiconductor body 10 within which the main current carrying section M and the sense current carrying section SE of the power semiconductor device P, in this case a power MOSFET, are formed. In order to show the structure of the power MOSFET P more clearly, the source, sense and gate electrode metallisation have been omitted from FIG. 2. As can be seen clearly from FIG. 2, the power MOSFET P comprises a plurality of source cells 11 formed using conventional DMOS processing technology. FIG. 3a shows a cross-sectional view through part of one cell 11 of the MOSFET P. The cell 11 comprises adjacent one major surface 10c of the semiconductor body 10 a p conductivity body region 14 which contains an n conductivity source region 17 and defines therewith a conduction channel area 14b under the insulated gate 18 of the MOSFET P. As shown, the p body region 14 may have a central relatively highly doped subsidiary region 14a which is shorted (either as shown by a moat etched through the source region 17 or by masking the source implant) to the source electrode S to inhibit parasitic bipolar action. The source electrode S, sense electrode S1 (not shown) and gate electrode G (not shown) are formed by metallisation provided on top of an insulating layer 30 and making contact to the source regions 17 and insulated gate 18, respectively, via appropriate contact holes. The drain electrode D is provided on the other major surface 10d of the semiconductor body 10.

Typically the power MOSFET P may consist of many hundreds or thousands of source cells 11. The periphery 18a of the insulated gate 12 may, as is usual, extend up onto surrounding field oxide (not shown) and, although not shown, conventional edge terminations such as Kao's rings and/or field plates may be provided at the periphery of the power MOSFET P.

The sense current carrying section SE comprises a number of the source cells 11 separated from the main current carrying section M by the definition of the metallisation (not shown in FIG. 2) to form the source electrode S and the sense electrode S1. The dashed lines x and y in FIG. 2 are intended to represent the respective adjacent boundaries of the sense electrode S1 and the source electrode S. Although FIG. 2 shows the sense current carrying section SE as being formed of nine source cells at a corner of the power MOSFET P, the actual number of source cells 11 forming the sense current carrying section SE and the location of the sense current carrying section SE within the power MOSFET P may be somewhat different. Thus, for example, the sense current carrying section SE could be formed by a single narrow row of source cells 11 to which the sense electrode S1 makes contact by passing over an uncontacted dead or dummy cell which contains no source region and which may partly overlap a surrounding peripheral guard region of the power MOSFET P. Such an arrangement may ensure that the sense source cells 11 are surrounded on average on two sides by cells of the main current carrying section M to ensure better matching in terms of process topography and thermal environment.

Figure 3B:
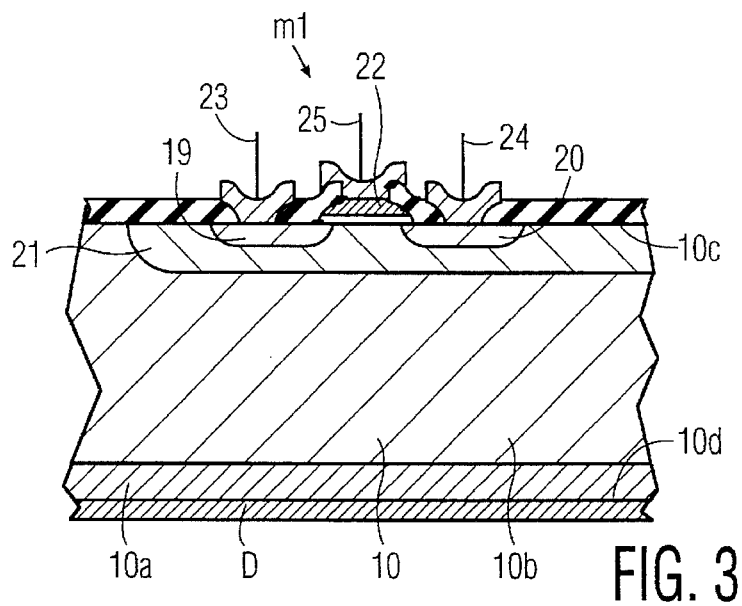

FIG. 3b shows a lateral NMOS transistor, for example the transistor M1 shown in FIGS. 1, 2 and 3, having source and drain regions 19 and 20 diffused in a p conductivity second region which in this example forms an isolation or well region 21 and an overlying insulated gate 22 and source, gate and drain electrodes 23, 24 and 25 formed on the insulating layer 30.

Figure 3C:
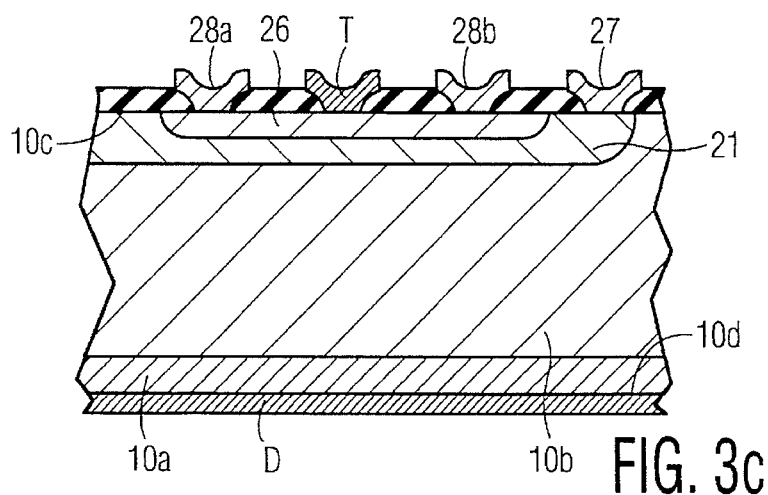

The resistor RZ may be formed as an external component or could be formed as a diffused resistor as shown in FIG. 3c. The resistor shown in FIG. 3c consists of an n conductivity region 26 within a p conductivity well or isolation region which may be the same region 21. An electrode 27 couples the well region 21 to a reference potential which is generally ground and resistor electrodes 28a and 28b are provided at each end of the region 26. As another possibility, the resistor RZ could be formed, as shown in FIG. 3f, as a thin film resistor formed on top of the insulating layer 30, usually over the well region 21. Such a thin film resistor is generally formed by an n conductivity doped polycrystalline silicon region 35 with respective electrodes 35a and 35b making contact through openings in the insulating layer 34. Where an integrated resistor is to form the variable resistor RZ, then the resistor structure will be provided, as shown in FIGS. 3c and 3f, with a tap off point or electrode connection T for coupling to the zener diode ZD1. One or more further tap off points (not shown) may be provided to enable the overall resistance of the resistor to be varied. Resistor structures such as those shown in FIG. 3c and 3f may also be used where desired to adjust the resistance of a coupling between two components. For example, such resistors may possibly be placed in series with the transistors M1, M2 and M3 to adjust the respective currents to provide particular desired circuit characteristics. Of course, where variability of the resistance is not required then any tap off points may be omitted.

Figure 3D:
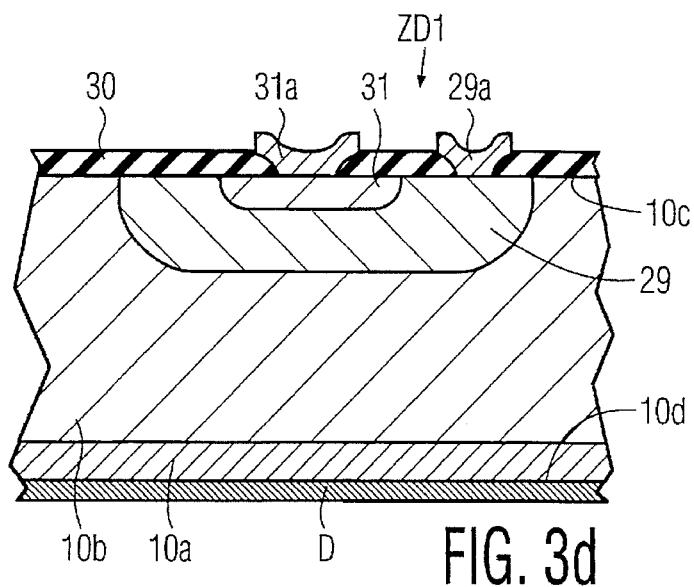

FIG. 3d shows a diffused diode, for example the zener diode ZD1, consisting of a relatively highly doped p conductivity region 29 within which is provided an n conductivity region 31 together with appropriate electrodes 29a and 31a making contact through contact holes in the insulating layer 30. The diode could alternatively be formed as a thin film diode as shown in FIG. 3e or as a series of such diodes.

Figure 3E:
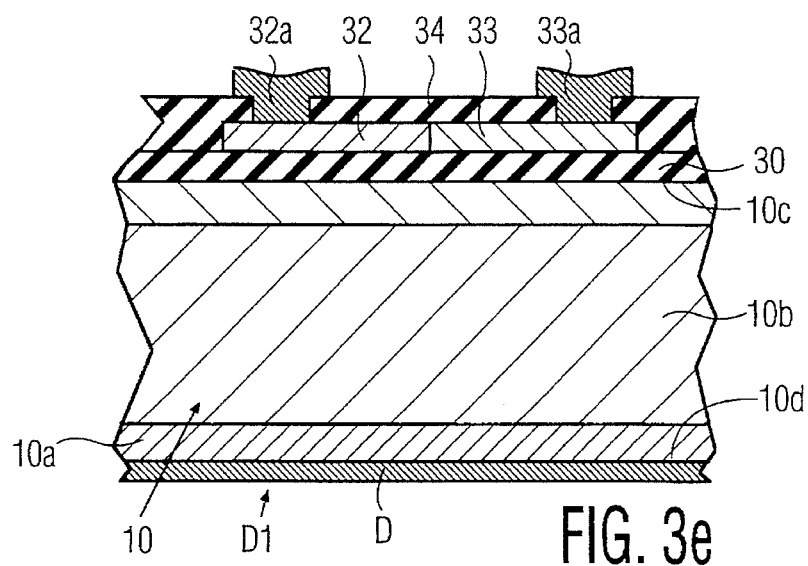
Figure 3F:
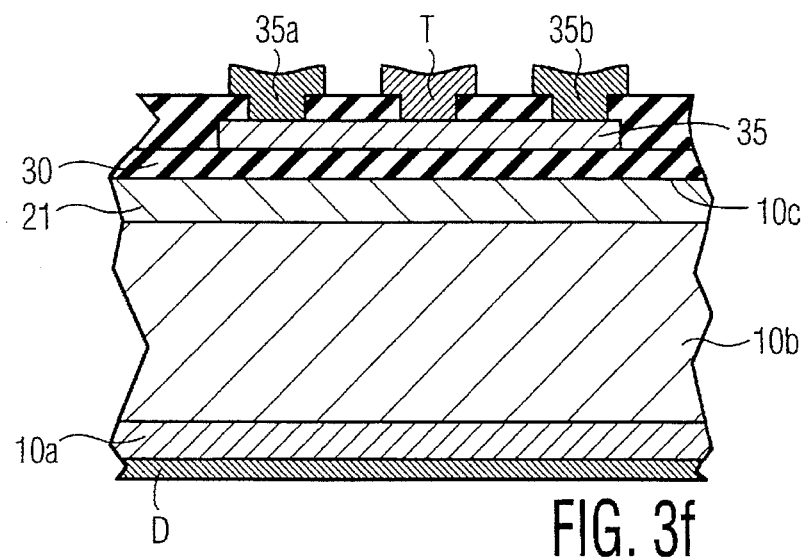

FIG. 3e shows a thin film pn junction diode consisting of oppositely doped regions 32 and 33 of polycrystalline silicon with respective electrodes 32a and 33a making contact through openings in an insulating layer 34.

Although in some of the embodiments described above, the power semiconductor device has been shown as a high side switch, that is coupled between the positive voltage supply line and the load and in some as a low side switch with the power semiconductor device coupled between the more negative voltage (generally earth or ground) supply line and the load, it will be appreciated that each of the described circuits could be used for either configuration.

Of course, the conductivity types and polarities given above may be reversed and the semiconductor body may be formed of a semiconductor other than silicon, for example germanium or a combination of semiconductor materials or a III–V semiconductor material. In addition, the power semiconductor device may be other than a power MOSFET and could be, for example, formed as an IGBT simply by reversing the conductivity type of the region 21 in FIG. 3 provided, of course, that any problems with inherent parasitic bipolar devices can be avoided. Also, the present invention may be applied to other types of power semiconductor devices in which the current supplied by a sense electrode is indicative of that between the first and second main electrodes of the power semiconductor device, for example a power bipolar device such as a power bipolar transistor.

Although the above embodiments describe certain components as being carried by the semiconductor body as diffused components, any of the components other than the power semiconductor device may be carried by the semiconductor body by being formed on an insulating layer provided over the power semiconductor device and may be, for example, amorphous or polycrystalline semiconductor thin film components. Of course, the various components need not necessarily be integrated with the power semiconductor device but may be separate discrete components or integrated together separately from the power semiconductor device in a separate semiconductor body or on a separate substrate.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

I claim:

1. A protected switch comprising a power semiconductor device having first and second main electrodes for coupling a load between first and second voltage supply lines and a control electrode coupled to a control voltage supply line and a sense electrode for providing in operation of the power semiconductor device a current that flows between the first and sense electrodes and is indicative of the current that flows between the first and second main electrodes, a current mirror arrangement having a first current path for passing a given current and a second current path for mirroring the given current and a control semiconductor device having first and second main electrodes coupled between the control electrode and the second main electrode of the power semiconductor device and a control electrode coupled to the second current path, the sense electrode of the power semiconductor being coupled to the second current path for causing, when the current provided by the sense electrode approaches the given current, the control semiconductor device to be rendered conducting to provide a conductive path between the control and the second main electrodes of the power semiconductor device to reduce the voltage at the control electrode and so regulate the current through the power semiconductor device.

2. A protected switch according to claim 1, wherein the first current path of the current mirror arrangement comprises the current path between the first and second main electrodes of a first transistor and the second current path of the current mirror arrangement comprises the current path between the first and second main electrodes of a second transistor, the first and second transistor having coupled control electrodes with one of the first and second transistor being diode-connected.

3. A protected switch according to claim 2, wherein the sense electrode and the control electrode of the control semiconductor device are coupled to the same one of the first and second electrodes of the second transistor.

4. A protected switch according to claim 1, wherein the control transistor and current mirror arrangement are carried by the semiconductor body carrying the power semiconductor device.

5. A protected switch according to claim 1, wherein the power semiconductor device comprises a first plurality of device cells coupled in parallel between the first and second main electrodes and a second smaller plurality of similar device cells coupled in parallel between the sense electrode and the first main electrode of the power semiconductor device.

6. A protected switch according to claim 1, wherein the power semiconductor device comprises a power MOSFET.

7. A protected switch according to claim 2, wherein the control transistor and current mirror arrangement are carried by the semiconductor body carrying the power semiconductor device.

8. A protected switch according to claim 2, wherein the power semiconductor device comprises a first plurality of device cells coupled in parallel between the first and second main electrodes and a second smaller plurality of similar device cells coupled in parallel between the sense electrode and the first main electrode of the power semiconductor device.

9. A protected switch according to claim 2, wherein the power semiconductor device comprises a power MOSFET.

* * * * *